United States Patent
Liu et al.

(10) Patent No.: US 11,504,727 B2
(45) Date of Patent: Nov. 22, 2022

(54) SPRAY DEVICE AND CLEANING APPARATUS

(71) Applicant: BEIJING NAURA MICROELECTRONICS EQUIPMENT CO., LTD., Beijing (CN)

(72) Inventors: Wei Liu, Beijing (CN); Xiaoyan Liu, Beijing (CN); Yi Wu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 27 days.

(21) Appl. No.: 17/288,461

(22) PCT Filed: Nov. 6, 2019

(86) PCT No.: PCT/CN2019/115971
§ 371 (c)(1),
(2) Date: Apr. 23, 2021

(87) PCT Pub. No.: WO2020/094053
PCT Pub. Date: May 14, 2020

(65) Prior Publication Data
US 2021/0379611 A1  Dec. 9, 2021

(30) Foreign Application Priority Data

Nov. 8, 2018  (CN) .......................... 201811324019.6

(51) Int. Cl.
*B05B 5/03* (2006.01)
*B08B 3/02* (2006.01)

(52) U.S. Cl.
CPC . *B05B 5/03* (2013.01); *B08B 3/02* (2013.01)

(58) Field of Classification Search
CPC ....... B05B 5/03; B05B 3/02; H01L 21/02052; H01L 21/67023
See application file for complete search history.

(56) References Cited

U.S. PATENT DOCUMENTS 3,561,444 A * 2/1971 Boucher .............. A61M 11/005
261/DIG. 65
3,866,831 A * 2/1975 Denton ............... B05B 17/0607
239/338

(Continued)

FOREIGN PATENT DOCUMENTS

| CN | 101607237 A | 12/2009 |
| CN | 103446691 A | 12/2013 |

(Continued)

OTHER PUBLICATIONS

World Intellectual Property Organization (WIPO) International Search Report for PCT/CN2019/115971 dated Jan. 23, 2020 7 Pages.

*Primary Examiner* — Steven M Cernoch
(74) *Attorney, Agent, or Firm* — Anova Law Group, PLLC

(57) ABSTRACT

The present disclosure provides a spray device and a cleaning apparatus. The spray device includes an atomization structure, which is configured to atomize a cleaning liquid when the cleaning liquid is sprayed to form liquid droplets, and a jet structure, which is configured to spray a gas along a determined direction to cause the gas sprayed to collide with the liquid droplets to form atomized particles. The spray device provided by the present disclosure may increase cleaning uniformity and cleaning efficiency to improve cleaning process results, and may further reduce an impact force to the to-be-cleaned surface by the liquid droplets to a certain level. Thus, the damage to a surface pattern of a wafer may be reduced.

20 Claims, 3 Drawing Sheets

(56) References Cited

U.S. PATENT DOCUMENTS

| | | | |
|---|---|---|---|
| 4,343,433 A | 8/1982 | Sickles et al. | |
| 6,901,938 B2* | 6/2005 | Sato | B08B 3/02 134/102.1 |
| 7,524,771 B2* | 4/2009 | Izumi | B08B 3/02 134/1 |
| 2002/0035762 A1* | 3/2002 | Okuda | B08B 3/02 134/102.1 |

FOREIGN PATENT DOCUMENTS

| | | | | |
|---|---|---|---|---|
| CN | 104772242 A | 7/2015 | | |
| CN | 105154614 A | 12/2015 | | |
| CN | 105344511 A | 2/2016 | | |
| CN | 105513999 A | 4/2016 | | |
| RU | 1801607 A1 | 3/1993 | | |
| TW | 550630 B | 9/2003 | | |
| WO | WO-9422592 A1 * | 10/1994 | | B05B 17/0646 |
| WO | WO-2009096346 A1 * | 8/2009 | | B05B 17/0623 |

\* cited by examiner

SPRAY DEVICE AND CLEANING APPARATUS

CROSS-REFERENCE TO RELATED APPLICATIONS

This application is a national phase entry under 35 U.S.C. § 371 of International Application No. PCT/CN2019/115971, filed on Nov. 6, 2019, which claims priority to Chinese Application No. 201811324019.6 filed on Nov. 8, 2018, the entire content of all of which are incorporated herein by reference.

TECHNICAL FIELD

The present disclosure generally relates to the semiconductor manufacturing field and, more particularly, to a spray device and a cleaning apparatus.

BACKGROUND

As a feature size of an integrated circuit continues to shrink, higher and higher requirements are imposed on the cleanliness and flatness of a wafer surface. Generally, the wafer surface needs to be cleaned to remove impurities and pollutants on the wafer surface pattern.

In a traditional cleaning and spraying technology, a liquid phase fluid is sprayed on the wafer surface by a nozzle located over the wafer. However, since large-size droplets or jet streams are sprayed from the nozzle, and the sizes of the droplets are not uniform, and the droplets may impact the wafer surface at a high flow rate, which will cause serious damages to the wafer surface pattern processed with 65 nm and below. The utilization rate of the liquid phase fluid is low, which results in extreme waste of resources.

SUMMARY

The present disclosure is intended to at least solve one of the technical problems in the existing technology. The present disclosure provides a spray device and a cleaning apparatus, which may increase cleaning uniformity and cleaning efficiency to improve a cleaning process result, and further reduce the impact force to the to-be-cleaned surface by liquid droplets to a certain level. Thus, the damage to a surface pattern of a wafer may be reduced.

To realize the purposes of the present disclosure, a spray device is provided. The spray device includes a first nozzle. The first nozzle includes:

an atomization structure, configured to atomize a cleaning liquid when the cleaning liquid is sprayed to form liquid droplets; and a jet structure, configured to spray a gas along a determined direction to cause the sprayed gas to collide with the liquid droplets to form atomized particles.

Optionally, the atomization structure includes an atomization body. An atomization channel is arranged in the atomization structure. The atomization channel penetrates the atomization body along a first direction. A liquid inlet end of the atomization channel is connected to the cleaning liquid source. A portion of the atomization body that forms the atomization channel is made of a semiconductor crystal material. The spray device further includes an electrode pulse system, which is configured to apply a pulse voltage to the semiconductor crystal material to cause the semiconductor crystal material to generate an electrostrictive effect that causes the cleaning liquid to form the liquid droplets when the cleaning liquid is sprayed from the atomization channel.

Optionally, the jet structure includes a jet body. A jet channel is arranged in the jet body. The jet channel penetrates the jet body along a second direction. The gas inlet end of the jet channel is connected to the gas source. The second direction is arranged to cause the gas sprayed from the gas outlet end of the jet channel to collide with the liquid droplets to form the atomized particles.

Optionally, a predetermined included angle is arranged between the first direction and the second direction.

Optionally, the first direction and the to-be-cleaned surface are perpendicular to each other.

Optionally, the atomization body includes a center portion and a plurality of edge portions. A center channel is arranged in the center portion. The plurality of edge portions are around the center portion at an interval and are fixedly connected to the center portion. Edge channels are arranged in the plurality of edge portions. Liquid inlet ends of the edge channels are connected to a liquid outlet end of the center channel. A plurality of atomization channels are included. The plurality of atomization channels are arranged in the plurality of edge portions in a one-to-one correspondence. Each of the plurality of atomization channels of the edge portions includes a plurality of atomized holes, liquid inlet ends of the plurality of atomized holes are connected to liquid outlet ends of the edge channels, and the plurality of atomization holes penetrate the plurality of edge portions along the first direction.

Optionally, for the plurality of edge portions, on a cross-section of the center portion parallel to the to-be-cleaned surface, orthographic projections of the plurality of atomized holes are divided into a plurality of atomized hole groups and are distributed on a circumference using a center of the cross-section as a center of a circle. Orthographic projections of a plurality of atomized holes in each of the atomized hole groups are arranged at least a row along a radial direction of the circumference at an interval.

Optionally, the jet body includes a plurality of jet split bodies. One of the plurality of jet split bodies being arranged between two neighboring edge portions. A plurality of jet channels are included and arranged in the plurality of jet split bodies in a one-to-one correspondence. The plurality of jet channels in the plurality of jet split bodies include a plurality of jet holes. The plurality of jet holes penetrate the plurality of jet split bodies along the second direction.

Optionally, for the plurality of jet split bodies, orthographic projections of the plurality of jet holes at cross-sections of the plurality of jet split bodies parallel to the to-be-cleaned surface are uniformly distributed relative to the cross-sections.

Optionally, the first nozzle further includes a nozzle body. The nozzle body is connected to the center portion and the plurality of jet split bodies. A liquid inlet channel and a gas inlet channel are arranged in the nozzle body. The liquid inlet channel is connected to the atomized channel and is configured to provide the cleaning liquid to the atomized channel. The gas inlet channel is an annular channel and surrounds the liquid inlet channel, and the gas inlet channel is connected to the jet channel to provide the gas.

Optionally, the first nozzle further includes a guide pipe. The guide pipe is connected to the atomization structure and the jet structure to remove atomized particles with a spray direction that is not perpendicular to the to-be-cleaned surface.

Optionally, the spray device further includes a first liquid inlet pipeline, a gas inlet pipeline, and a first drive source. The first drive source is configured to drive the first nozzle to swing back and forth between an edge and a center of the to-be-cleaned surface. The first liquid inlet pipeline is configured to provide the cleaning liquid to the atomization structure. A first flow regulation valve is arranged in the first liquid inlet pipeline. The gas inlet pipeline is configured to provide the gas to the jet structure.

Optionally, the first drive source includes a first drive arm and a first rotation motor. The first drive arm is arranged on a side of a carrier that is configured to carry the to-be-cleaned workpiece along a direction perpendicular to the to-be-cleaned surface. The first nozzle is arranged at the first drive arm and located over the carrier. The first rotation motor is configured to drive the first drive arm to swing back and forth between the edge and the center of the to-be-cleaned surface.

Optionally, the spray device further includes a second nozzle, a second liquid inlet pipeline, and a second drive source, The second nozzle is configured to spray the cleaning liquid towards the to-be-cleaned surface. The second drive source is configured to drive the second nozzle to swing back and forth between the edge and the center of the to-be-cleaned surface. The second liquid inlet pipeline is configured to provide the cleaning liquid to the second nozzle. A second flow regulation valve is arranged in the second liquid inlet pipeline. A flow of the cleaning liquid in the second liquid inlet pipeline is larger than a flow of the cleaning liquid in the first liquid inlet pipeline.

Optionally, the second drive source includes a second drive arm and a second rotation motor. The second drive arm is arranged on a side of a carrier that is configured to carry a to-be-cleaned workpiece along a direction perpendicular to the to-be-cleaned surface. The second nozzle is arranged at the second drive arm and located over the carrier. The second rotation motor is configured to drive the second drive arm to swing swing back and forthlly between the edge and the center of the to-be-cleaned surface.

Optionally, a diameter of the atomization channel ranges from 1 to 300 μm.

Optionally, a diameter of the jet channel ranges from 1 to 300 μm.

As another technical solution, the present disclosure further provides a cleaning apparatus. The cleaning apparatus includes a carrier configured to carry the to-be-cleaned workpiece and a spray device configured to clean the to-be-cleaned surface of the to-be-cleaned workpiece. The spray device may use the spray device of above embodiments.

The present disclosure has the following beneficial effects.

The spray device provided by the present disclosure may first be configured to atomize the liquid to form the liquid droplets through the atomization structure. Then, the jet structure may be configured to jet the gas to collide with the liquid droplets to form atomized parties. That is, the cleaning liquid may be atomized twice to form the atomized particles with smaller sizes and more uniform. During a cleaning process, the atomized particles may increase a physical force perpendicular to a to-be-cleaned surface. Thus, a transfer process of impurities in the wafer surface pattern to the fluid body may be speeded up. The cleaning uniformity and cleaning efficiency may be increased, and the cleaning process results may be improved. Meanwhile, the secondary atomization of the cleaning liquid may be beneficial to improve the utilization rate of the cleaning liquid and deionized water. In addition, since the formed atomized particles have smaller sizes and are more uniform after two atomizations, an impact force on the to-be-cleaned surface may be reduced to a certain level. Thus, the damage to the wafer surface pattern may be reduced.

The cleaning apparatus provided by the present disclosure may use the spray device provided by the present disclosure, which may not only increase the cleaning uniformity and cleaning efficiency to improve a process result, but also reduce the impact force to the to-be-cleaned surface by the liquid droplets at a certain level. Thus, the damage to the wafer surface pattern may be reduced.

DETAILED DESCRIPTION OF THE EMBODIMENTS

To make those of ordinary skill in the art to better understand the technical solutions of the present disclosure, a spray device and a cleaning apparatus provided by the present disclosure are described in detail below in connection with the accompanying drawings.

Figure 1:
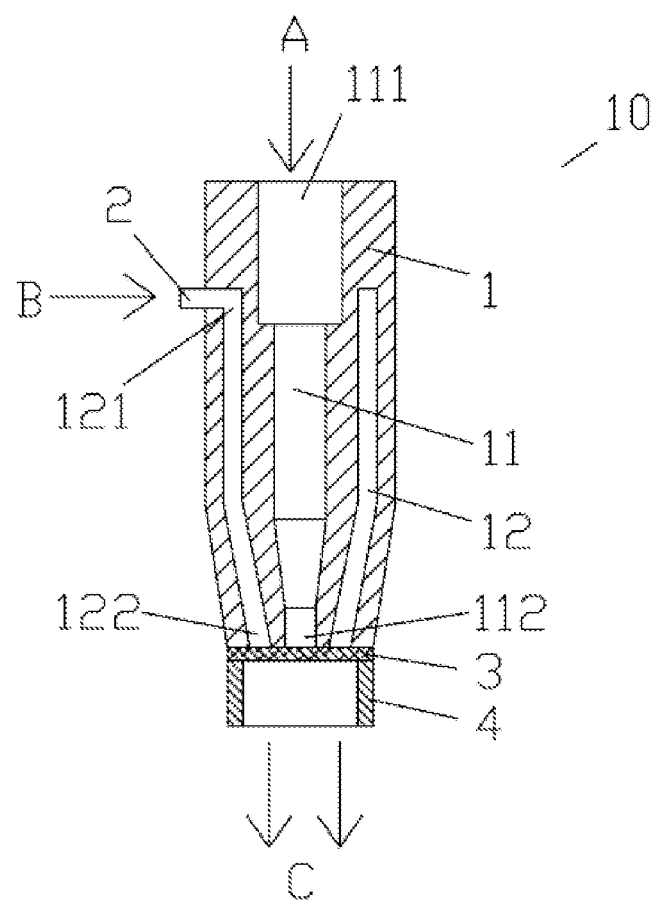
FIG. 1 is a schematic cross-sectional diagram showing a first nozzle of a spray device according to some embodiments of the present disclosure.
Figure 2:
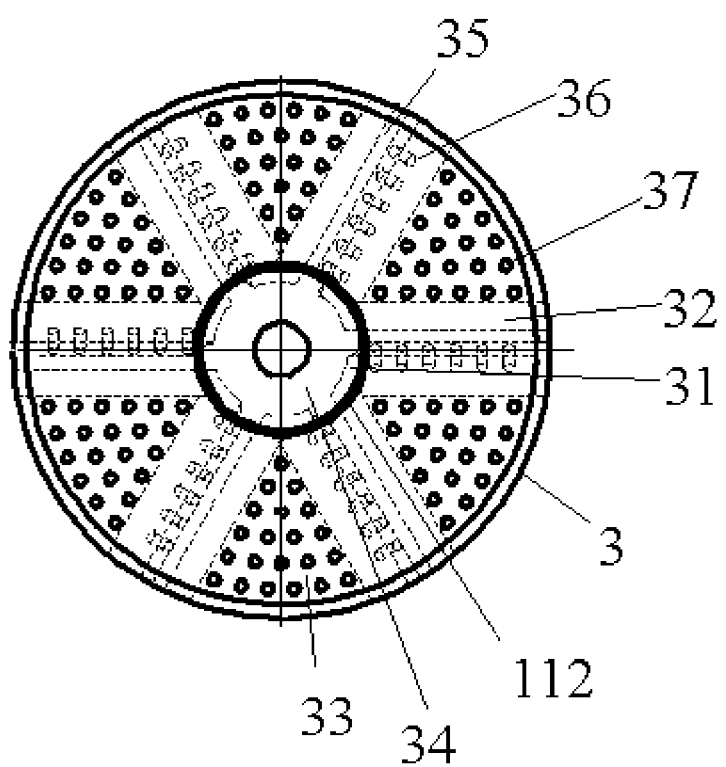
FIG. 2 is a schematic a transparent view showing an atomization structure according to some embodiments of the present disclosure.
Figure 3:
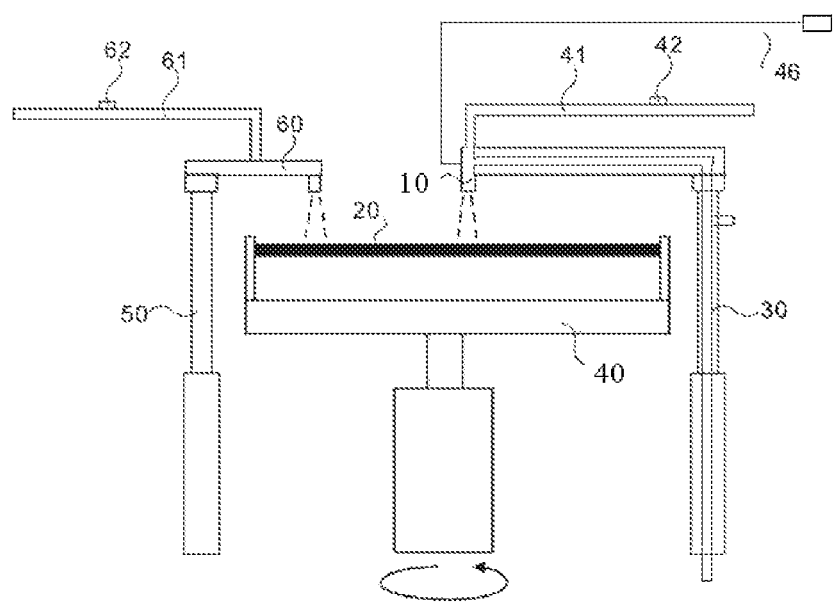
FIG. 3 is a schematic structural diagram of a spray device according to some embodiments of the present disclosure.

Referring to FIG. 1 to FIG. 3, the present disclosure provides a spray device, which includes a first nozzle 10. The first nozzle 10 includes a nozzle body 1 and a disc-shaped structure 3 connected to the nozzle body 1. A liquid inlet channel 11 and an gas inlet channel 12 are arranged in the nozzle body 1. The disc-shaped structure 3 includes an atomization structure and a jet structure that are formed an integrated structure.

A liquid inlet end 111 of the liquid inlet channel 11 may be connected to a cleaning liquid source (not shown) for providing a cleaning liquid A to transfer the cleaning liquid. The atomization structure is connected to the liquid outlet end 112 of the liquid inlet channel 11, which is configured to atomize the cleaning liquid to form droplets when the cleaning liquid is sprayed from the atomization structure. A gas inlet end 121 of the gas inlet channel 12 is connected to a gas source for providing a gas B to transfer the gas. A jet structure is connected to the air outlet end 122 of the gas inlet channel 12 and may be configured to jet the gas in a determined direction. Thus, the jetted from the jet structure may collide with the liquid droplets to form atomized particles.

The above-mentioned first nozzle 10 may be configured to perform secondary atomization of the cleaning liquid to form atomized particles with smaller sizes and more uniform. Specifically, at first, the atomization structure may be configured to atomize liquid to form small liquid droplets. Then, the jet structure may be configured to jet the gas to collide with the liquid droplets to form atomized particles. That is, the cleaning liquid may be atomized twice to form the atomized particles with smaller sizes and more uniform. During a cleaning process, the atomized particles may increase a physical force perpendicular to a to-be-cleaned surface. Thus, a transfer process of impurities in the wafer surface pattern to the fluid body may be speeded up. The cleaning uniformity and cleaning efficiency may be increased, and the cleaning process results may be improved. Meanwhile, the secondary atomization of the cleaning liquid may be beneficial to improve the utilization rate of the cleaning liquid and deionized water. In addition, since the formed atomized particles have smaller sizes and are more uniform after two atomizations, an impact force on the to-be-cleaned surface may be reduced to a certain level. Thus, the damage to the wafer surface pattern may be reduced.

In some embodiments, as shown in FIG. 2, in the disc-shaped structure 3, the atomization structure includes an atomization body. The atomization body includes a central portion 31 and a plurality of edge portions 32, which form a "gear" like structure. A central channel 34 is arranged at the central portion 31. A liquid inlet end of the central channel 34 is connected to a liquid outlet end 112 of the liquid inlet channel 11. The plurality of edge portions 32 are arranged around the central portion 31 at an interval. The plurality of edge portions 32 are connected to the central portion 31. In addition, an edge channel 35 is arranged at each of the plurality of edge portions 32. A liquid inlet end of the edge channel 35 is connected to the liquid outlet end of the central channel 34.

An atomization channel that is configured to transfer the cleaning liquid is arranged at the atomization body. A liquid inlet end of the atomization channel is connected to the liquid outlet end 112 of the liquid inlet channel 11. The atomization channel penetrates the atomization body along a first direction. In addition, a portion of the atomization body that forms the atomization channel is made of a semiconductor crystal material such as lead zirconate titanate piezoelectric ceramics. The spray device further includes an electrode pulse system 46, which may be configured to apply a pulse voltage to the semiconductor crystal material. Thus, the semiconductor crystal material may generate an electrostrictive effect that may cause the liquid in the atomization channel to form the liquid droplets when the liquid is jetted.

Optionally, the first direction and the to-be-cleaned surface may be perpendicular to each other, or the first direction may also form an included angle with the to-be-cleaned surface.

In practical applications, the portion of the atomization body that forms the atomization channel may be a portion made of the semiconductor crystal material arranged at the atomization body. The atomization channel may be arranged in the portion. In some embodiments, the atomization channel may be arranged in the atomization body. The portion of an inner wall of the atomization body that forms the atomization channel may be made of the semiconductor crystal material.

In some embodiments, a plurality of atomization channels may be included. The plurality of atomization channels may be arranged at the plurality of edge portions 32 in a one-to-one correspondence. Moreover, the atomization channel of each edge portion 32 includes a plurality of atomization holes 36. Liquid inlet ends of the plurality of the atomization holes 36 is connected to the liquid outlet ends of the edge channels 35. The plurality of atomization holes 26 penetrate the plurality of edge portions 32 along the first direction. Since the above-mentioned atomization body is made of the semiconductor crystal material such as the lead zirconate titanate piezoelectric ceramics, when the electrode pulse system 46 is turned on, the atomization body may generate the electrostrictive effect at the plurality of atomization holes 36 to cause the liquid of the plurality of atomization holes 36 to be jetted out from the liquid outlet end of the plurality of atomizing holes 36. Meanwhile, the liquid jetted from the plurality of atomization holes 36 may be atomized to form the liquid droplets. Thus, the first atomization of the cleaning liquid may be realized.

During the cleaning process, cleaning liquid A may enter the liquid inlet channel 11 from the liquid inlet end 111 of the liquid inlet channel 11 and may be transferred to the atomization structure via the liquid inlet channel 11. In the atomization structure, firstly, the cleaning liquid may flow to the plurality of edge channels 35 via the central channel 34. Then, the cleaning liquid may flow to the plurality of atomization holes 36 via the plurality of edge channels 35. Finally, the liquid of the plurality of atomization holes 36 is jetted out from the liquid outlet ends of the plurality of atomization holes 36 when the electrode pulse system 46 is turned on and may be atomized to form the liquid droplets.

Optionally, for the plurality of edge portions 32, on the cross-section (i.e., the surface parallel to a transmission surface shown in FIG. 2) of the central portion 31 parallel to the to-be-cleaned surface, the orthographic projection of the plurality of atomization holes 36 may be divided into a plurality of atomization hole groups and may be distributed on a circumference with a center cross-section as the center of the circle at an interval. The orthographic projection of the plurality of atomization holes 36 of each atomization hole group is arranged at least one row along the radial direction of the circle. Thus, a spray range of the liquid droplets may be expanded to increase the collision probability of the liquid droplets and the gas to increase the atomization efficiency.

Optionally, the diameter of the atomization hole 36 may range from 1 to 300 μm. In this diameter range, the atomization of the cleaning liquid may be achieved.

In some embodiments, a jet structure includes a jet body. A jet channel is arranged in the jet channel. The gas input end of the jet channel is connected to the gas output end 122 of the gas inlet channel 12. The gas output end of the jet channel penetrates the gas body in a second direction. Thus, the gas may be jetted from the jet body.

The above-mentioned second direction may be arranged in a way that the jetted gas may collide with the liquid droplets to form the atomized particles. Optionally, the first direction and the second direction include a predetermined included angle. Thus, the liquid droplets jetted from the atomization channel and the jetted from the jet channel may converge with each other to increase the collision probability of the liquid droplets and the gas. For example, the first direction and the to-be-cleaned surface may be perpendicular to each other, and the predetermined included angle may be formed between the second direction and the to-be-cleaned surface. For another example, the predetermined included angle may be formed between the first direction and the to-be-cleaned surface, and the second direction and the to-be-cleaned surface may be perpendicular to each other. For another example, predetermined included angles may be formed between both the first direction and a second direction, and the first direction and the to-be-cleaned surface. Of course, the first direction and the second direction may be parallel to each other, as long as the liquid droplets and the gas may collide with each other to form the atomized particles.

In some embodiments, the jet body includes a plurality of jet split bodies 33. One jet split body 33 may be arranged between two adjacent edge portions 32 of the atomization body. Moreover, a plurality of jet channels are included. The jet channels are arranged in the plurality of jet split bodies 33 in a one-to-one correspondence. The jet channel of each jet split body 33 includes a plurality of jet holes 37. The gas inlet ends of the plurality of jet holes 37 are connected to the gas outlet end 122 of the gas inlet channel 12. The jet holes 37 penetrate the plurality of jet split bodies 33 along the second direction.

Optionally, the diameter of the jet hole 37 may range from 1 to 300 μm. Within the diameter range, the gas may be jetted at a high speed.

During the cleaning process, gas B may enter the gas inlet channel 12 from the gas inlet end 121 of the jet channel 12. In the jet structure, gas B may be jetted from the jet holes 37, and collide with the liquid to form the atomized particles with smaller sizes and more uniform. Thus, the second atomization of the cleaning liquid may be realized.

Optionally, for the jet split bodies 33, the orthographic projections of the plurality jet holes 37 at the cross-sections of the jet split bodies 33 parallel to the to-be-cleaned surface (i.e., the surface parallel to the transmission surface shown in FIG. 2) are uniformly distributed relative to the cross-sections. For example, the orthographic projections of the air jet holes 37 are evenly spaced and distributed across the entire cross-sections. As such, the gas may be jetted more uniformly to increase the collision probability of the liquid droplets and the gas. Thus, the atomization efficiency may be increased.

In some embodiments, by arranging a jet split body 33 between every two adjacent edge portions 32 of the atomization body, the atomization structure and the jet structure may be arranged alternatively to increase the collision probability of the liquid droplets and the gas. Thus, the atomization efficiency may be increased.

It needs to be noted that, in some embodiments, the atomization body includes the central portion 31 and the plurality of edge portions 32. The central portion 31 and the plurality of edge portions 32 form the "gear" like structure. The gas split bodies 33 have fan-shaped structures. Thus, the atomization structure and the jet structure together form the disc-shaped structure 3, but the present disclosure is not limited to this. In practical applications, the atomization structure and the jet structure may also form an integrated structure of any other shapes, or may also form a separate structure.

In some embodiments, the gas inlet channel 12 may be an annular channel and surround the liquid inlet channel 11. As such, the gas may be jetted more uniformly to increase the collision probability of the liquid droplets and the gas. Thus, the atomization efficiency may be increased.

In some embodiments, the first nozzle 10 also includes a guide pipe 4. An end of the guide pipe 4 is connected to the atomization structure and the jet structure, that is, connected to the disc-shaped structure 3, which is configured to remove atomized particles with a spray direction that is not perpendicular to the to-be-cleaned surface. Only atomized particles C that are perpendicular to the to-be-cleaned surface may be retained.

In some embodiments, as shown in FIG. 3, a carrier 40 is configured to carry a to-be-cleaned workpiece 20. The carrier 40 may also drive the to-be-cleaned workpiece 20 to rotate during the cleaning process to improve the cleaning efficiency and cleaning uniformity. Moreover, the spray device also includes a first liquid inlet pipeline 41, a gas inlet pipeline 2, and a first drive source (not shown in FIGs.). The first drive source may be configured to drive the first nozzle 10 to swing back and forth between an edge and a center of the to-be-cleaned surface of the to-be-cleaned workpiece 20. With the cooperation of the rotation of the to-be-processed workpiece 20, the atomized particles sprayed by the first nozzle 10 may cover the entire to-be-cleaned surface. Simultaneously, the first nozzle 10 may swing back and forth between the edge and the center of the to-be-cleaned surface.

The liquid outlet end of the first liquid inlet pipeline 41 is connected to the liquid inlet end 111 of the liquid inlet channel 11 of the first nozzle 10 to provide the cleaning liquid to the liquid inlet channel 11. Moreover, a first flow regulation valve 42 is arranged at the first liquid inlet pipeline 41 and is configured to adjust the flow of the cleaning liquid of the first liquid inlet pipeline 41. The gas outlet end of the gas inlet pipeline 2 is connected to the gas inlet end 121 of the gas inlet channel 12 to provide the gas to the gas inlet channel 12.

In some embodiments, the first drive source includes a first drive arm 30 and a first rotation motor (not shown in FIGs.). The first drive arm 30 is arranged on a side of the carrier 40 along a direction that is perpendicular to the to-be-cleaned surface. The first nozzle 10 is arranged on the first drive arm 30 and is located over the carrier 40. The first rotation motor may be configured to drive the first drive arm 30 to swing back and forth between the edge and the center of the to-be-cleaned surface.

Of course, in practical applications, the first drive arm 30 may also have another rotation path, as long as the atomization particles can cover the entire to-be-cleaned surface, and the first nozzle 10 can swing swing back and forthlly between the edge and the center of the to-be-cleaned surface. In some embodiments, a linear drive source may be used instead of the rotation drive source. Under this situation, the linear drive source may be configured to drive the first nozzle 10 to swing back and forth linearly along the radial direction of the to-be-cleaned surface. As such, the atomization particles can also cover the entire to-be-cleaned surface. Meanwhile, the first nozzle 10 may swing swing back and forthlly between the edge and the center of the to-be-cleaned surface.

In some embodiments, the spray device also includes a second nozzle 60, a second liquid inlet pipeline 61, and a second drive source. The second nozzle 60 may be configured to spray the cleaning liquid to the to-be-cleaned surface. The second drive source may be configured to drive the second nozzle 60 to swing back and forth between the edge and the center of the to-be-cleaned surface. The second liquid inlet pipeline 61 may be configured to provide the cleaning liquid to the second nozzle 60. Moreover, a second flow regulation valve 62 is arranged at the second liquid inlet pipeline 61. The flow of the liquid in the second liquid inlet pipeline 61 may be larger than the flow of the liquid in the first liquid inlet pipeline 41.

During the cleaning process, firstly, a second nozzle 60 may be configured to spray a relatively large flow of the cleaning liquid toward the to-be-cleaned surface, so that the to-be-cleaned surface may be evenly covered by a thin layer of the cleaning liquid. Then, the first nozzle 10 may be configured to spray the atomized particles after the second atomization towards the to-be-cleaned surface. The atomized particles may be injected into the thin layer of the cleaning liquid, which may increase a physical force applying on the pollutants, and drive the vibration of the thin layer of the cleaning liquid simultaneously to speed up the transfer process of the pollutants to the cleaning liquid. Thus, the cleaning efficiency may be increased, meanwhile, the damage to the wafer surface pattern may further be reduced.

In some embodiment, the second drive source includes a second drive arm 50 and a second rotation motor (not shown in FIGs). The second drive arm 50 is arranged on a side of the carrier 40 along a direction that is perpendicular to the to-be-cleaned surface and opposite to the first drive arm 30. The second nozzle 60 is arranged on the second drive arm 50 and is located over the carrier 40. The second rotation motor may be configured to drive the second drive arm to swing back and forth between the edge and the center of the to-be-cleaned surface.

Similar to the first drive source, the second drive arm 50 may also have another rotation path. In some embodiments, a linear drive source may be used instead of the rotation drive source. Under this situation, the linear drive source may be configured to drive the second nozzle 60 to swing back and forth linearly along the radial direction of the to-be-cleaned surface. Thus, the atomized particles may also cover the entire to-be-cleaned surface.

In summary, embodiments of the present disclosure provide the spray device. At first, the atomization structure may be configured to atomize the liquid to form the liquid droplets. The jet structure may be then configured to jet the gas to collide with the liquid droplets to form the atomized particles. That is, after the two times atomizations, the cleaning liquid may form the atomized particles with smaller size and more uniform. During the cleaning process, the atomized particles may increase the physical force perpendicular to the to-be-cleaned surface. Thus, the transfer process of impurities in the wafer surface pattern to the fluid body may be speeded up to increase the cleaning uniformity and the cleaning efficiency. Thus, the cleaning process result may be improved. Meanwhile, it is beneficial to improve the utilization rate of the cleaning liquid and deionized water. In addition, since the atomized particles formed after the two atomizations have smaller sizes and are more uniform, the impact force to the to-be-cleaned surface may be reduced to a certain level. Thus, the damage to the surface pattern of the wafer may be reduced.

As another technical solution, embodiments of the present disclosure also provide a cleaning apparatus. As shown in FIG. 3, The cleaning apparatus includes the carrier 40 that is configured to carry the to-be-cleaned workpiece 20 and a spray device that is configured to clean the to-be-cleaned surface of the to-be-cleaned workpiece 20. The spray device may include the spray device provided in embodiments of the present disclosure.

Embodiments of the present disclosure provide the cleaning apparatus, which includes the spray device of embodiments of the present disclosure. The cleaning uniformity and the cleaning efficiency may be increased, the cleaning process result may be improved, and the impact force to the to-be-cleaned surface by the liquid droplets may be reduced to a certain level. Thus, the damage to the surface pattern of the wafer may be reduced.

It should be noted that, the above embodiments are merely exemplary embodiments used to illustrate the principle of the present disclosure. However, the present disclosure is not limited to this. For those of ordinary skill in the art, various modifications and improvements may be made without departing from the spirit and essence of the present disclosure, and these modifications and improvements are also within the scope of the present disclosure.

What is claimed is:

1. A spray device, comprising:
a first nozzle including:
an atomization structure, configured to atomize a cleaning liquid when the cleaning liquid is sprayed to form liquid droplets; and
a jet structure, configured to spray a gas along a determined direction to cause the gas to collide with the liquid droplets to form atomized particles;
wherein:
the atomization structure includes an atomization body;
an atomization channel is arranged in the atomization body and penetrates the atomization body along a first direction;
a liquid inlet end of the atomization channel is connected to the cleaning liquid source;
a portion of the atomization body that forms the atomization channel is made of a semiconductor crystal material; and
an electrode pulse system, configured to apply a pulse voltage to the semiconductor crystal material to cause the semiconductor crystal material to generate an electrostrictive effect that causes the cleaning liquid to form the liquid droplets when the cleaning liquid is sprayed from the atomization channel.

2. The spray device according to claim 1, wherein the jet structure includes:
a jet body, including a jet channel, wherein:
the jet channel penetrates the jet body along a second direction;
a gas inlet end of the jet channel is connected to the gas source; and
the second direction is arranged to cause the gas sprayed from the gas outlet end of the jet channel to collide with the liquid droplets to form the atomized particles.

3. The spray device of claim 2, wherein a predetermined included angle is arranged between the first direction and the second direction.

4. The spray device of claim 3, wherein the first direction and the to-be-cleaned surface are perpendicular to each other.

5. The spray device of claim 2, wherein the atomization body includes:
a center portion, including a center channel;
a plurality of edge portions, being around the center portion at an interval and fixedly connected to the center portion, wherein:
edge channels are arranged in the plurality of edge portions;
liquid inlet ends of the edge channels are connected to a liquid outlet end of the center channel;
a plurality of atomization channels are arranged in the plurality of edge portions in a one-to-one correspondence;
each of the plurality of atomization channels of the edge portions includes a plurality of atomized holes;
liquid inlet ends of the plurality of atomized holes are connected to liquid outlet ends of the edge channels; and
the plurality of atomization holes penetrate the plurality of edge portions along the first direction.

6. The spray device of claim 5, wherein for the plurality of edge portions, on a cross-section of the center portion parallel to the to-be-cleaned surface:
orthographic projections of the plurality of atomized holes are divided into a plurality of atomized hole groups and are distributed on a circumference using a center of the cross-section as a center of a circle; and orthographic projections of a plurality of atomized holes in each of the atomized hole groups are arranged at least in a row along a radial direction of the circumference at an interval.

7. The spray device of claim 5, wherein the jet body includes:
a plurality of jet split bodies, including:
a plurality of jet channels, arranged in the plurality of jet split bodies in a one-to-one correspondence, wherein:
one of the plurality of jet split bodies being arranged between two neighboring edge portions;
the plurality of jet channels in the plurality of jet split bodies include a plurality of jet holes; and
the plurality of jet holes penetrate the plurality of jet split bodies along the second direction.

8. The spray device of claim 7, wherein for the plurality of jet split bodies, orthographic projections of the plurality of jet holes at cross-sections of the plurality of jet split bodies parallel to the to-be-cleaned surface are uniformly distributed relative to the cross-sections.

9. The spray device of claim 7, wherein the first nozzle further includes:
a nozzle body, connected to the center portion and the plurality of jet split bodies and including:
a liquid inlet channel, connected to the atomized channel and configured to provide the cleaning liquid to the atomized channel; and
a gas inlet channel, being an annular channel, surrounding the liquid inlet channel, and being connected to the jet channel to provide the gas.

10. The spray device of claim 1, wherein the first nozzle further includes:
a guide pipe, connected to the atomization structure and the jet structure to remove atomized particles with a spray direction that is not perpendicular to the to-be-cleaned surface.

11. The spray device of claim 1, further comprising:
a first drive source, configured to drive the first nozzle to swing back and forth between an edge and a center of the to-be-cleaned surface;
a first liquid inlet pipeline, configured to provide the cleaning liquid to the atomization structure, and including a first flow regulation valve; and
a gas inlet pipeline, configured to provide the gas to the jet structure.

12. The spray device of claim 11, wherein the first drive source includes:
a first drive arm, arranged on a side of a carrier that is configured to carry the to-be-cleaned workpiece along a direction perpendicular to the to-be-cleaned surface, and the first nozzle being arranged at the first drive arm and located over the carrier; and
a first rotation motor, configured to drive the first drive arm to swing back and forth between the edge and the center of the to-be-cleaned surface.

13. The spray device according to claim 11, further comprising:
a second nozzle, configured to spray the cleaning liquid towards the to-be-cleaned surface;
a second drive source, configured to drive the second nozzle to swing back and forth between the edge and the center of the to-be-cleaned surface;
a second liquid inlet pipeline, configured to provide the cleaning liquid to the second nozzle, and including a second flow regulation valve, wherein a flow of the cleaning liquid in the second liquid inlet pipeline is larger than a flow of the cleaning liquid in the first liquid inlet pipeline.

14. The spray device according to claim 13, wherein the second drive source includes:
a second drive arm, arranged on a side of a carrier that is configured to carry a to-be-cleaned workpiece along a direction perpendicular to the to-be-cleaned surface and including the second nozzle arranged at the second drive arm and located over the carrier; and
a second rotation motor, configured to drive the second drive arm to swing back and forth between the edge and the center of the to-be-cleaned surface.

15. The spray device according to claim 1, wherein a diameter of the atomization channel ranges from 1 to 300 μm.

16. The spray device according to claim 2, wherein a diameter of the jet channel ranges from 1 to 300 μm.

17. A cleaning apparatus, comprising:
a carrier, configured to carry a to-be-cleaned workpiece; and
a spray device, configured to clean a to-be-cleaned surface of the to-be-cleaned workpiece, and including:
a first nozzle including:
an atomization structure, configured to atomize a cleaning liquid when the cleaning liquid is sprayed to form liquid droplets; and
a jet structure, configured to spray a gas along a determined direction to cause the gas to collide with the liquid droplets to form atomized particles;
wherein:
the atomization structure includes an atomization body;
an atomization channel is arranged in the atomization body and penetrates the atomization body along a first direction;
a liquid inlet end of the atomization channel is connected to the cleaning liquid source;
a portion of the atomization body that forms the atomization channel being is made of a semiconductor crystal material; and
an electrode pulse system, configured to apply a pulse voltage to the semiconductor crystal material to cause the semiconductor crystal material to generate an electrostrictive effect that causes the cleaning liquid to form the liquid droplets when the cleaning liquid is sprayed from the atomization channel.

18. The cleaning apparatus according to claim 17, wherein the jet structure includes:
a jet body, including a jet channel, wherein:
the jet channel penetrates the jet body along a second direction;
a gas inlet end of the jet channel is connected to the gas source; and
the second direction is arranged to cause the gas sprayed from the gas outlet end of the jet channel to collide with the liquid droplets to form the atomized particles.

19. The cleaning apparatus of claim 18, wherein a predetermined included angle is arranged between the first direction and the second direction.

20. The spray device of claim 19, wherein the first direction and the to-be-cleaned surface are perpendicular to each other.

* * * * *